United States Patent [19]

Moore et al.

[11] 4,430,727
[45] Feb. 7, 1984

[54] STORAGE ELEMENT RECONFIGURATION

[75] Inventors: Brian B. Moore, Poughkeepsie; John T. Rodell, Wappingers Falls; Arthur J. Sutton, Cold Spring; Jeff D. Vowell, Poughkeepsie, all of N.Y.

[73] Assignee: International Business Machines Corp., Armonk, N.Y.

[21] Appl. No.: 319,869

[22] Filed: Nov. 10, 1981

[51] Int. Cl.³ .............................................. G06F 11/00
[52] U.S. Cl. ...................................... 364/900; 371/10
[58] Field of Search ................... 364/200, 900; 371/10

[56] References Cited

U.S. PATENT DOCUMENTS

3,803,560  4/1974  DeVoy et al. .................. 371/10 X

Primary Examiner—Raulfe B. Zache
Attorney, Agent, or Firm—Edward S. Gershuny

[57] ABSTRACT

This is a system which is used to perform reconfiguration of storage elements in order to permit removal of one or more of the elements for servicing or other reasons. If a storage element that is to be taken off line contains material that is crucial to the continued operation of the system, that material is copied to appropriate areas in other storage elements. After all crucial material has been copied to alternate locations, the original storage element can be taken off line for servicing or other purposes.

9 Claims, 6 Drawing Figures

STORAGE ELEMENT RECONFIGURATION

BACKGROUND OF THE INVENTION

This invention relates to configuration and reconfiguration of storage elements in a storage system. More particularly, it relates to the configuration and reconfiguration of such elements in order to permit removal of one or more of the elements for servicing or other reasons.

There can be occasions when it is desirable or necessary to take one or more elements of a multielement storage system off line. One typical reason for doing this is the occurrence of a predetermined threshold of errors within a given element. However, if crucial (essential) portions of system programming (or system date) are within the storage element that is to be taken out of the operational system, the system will not be able to continue processing if the element is simply removed. For this reason, it was common in the prior art not to remove a storage element if it contained essential data or programs unless its removal were absolutely necessary. The removal typically would be accomplished at the end of processing, and would be followed by a new initial program load into the remaining storage elements, and substantially complete reinitialization of the storage system.

One of the reasons for the brute force approach mentioned above, was that the crucial material (data and/or program) within an element that was to be taken off line might occupy large amounts of storage and might have been assigned to the storage in any of various interleaving or other algorithmic schemes, some involving great complexity. Thus, it was not practical to simply rewrite the contents of the element that was to be taken off line into some other storage element, unless there were another storage element standing idle to be used as a spare for just such emergencies. Keeping such spares on hand is, of course, a significant added expense to a system, and is not desirable unless absolutely necessary. Another approach that could be used would be to restrict the use of certain storage elements only to temporary material which would not be needed in the event of reconfiguration of a system. However, this would introduce additional complexity into the assignment and reassignment of addresses during processing and thus could impact the throughput performance of a system. Also, a storage system in which various elements are pre-dedicated only to certain types of material will generally require more storage in order to accommodate varying workloads than a system in which all elements can be used for any type of material.

SUMMARY OF THE INVENTION

In accordance with a preferred embodiment of this invention, the above and other problems in the prior art are solved through the provision of a system which, in essence, performs the following four steps when there is a need to take a storage element off line: (1) within the element that is to go off line, the system identifies storage locations containing crucial material that is essential to the continued operation of the system; (2) an area is identified within the remainder of the storage system that is large enough to hold the crucial material; (3) the crucial material is copied to the new area; and (4) addresses are reassigned so that references to the crucial material will result in correct access of the material.

The first two of the steps mentioned above are accomplished primarily through the use of tables that are created and maintained each time that a block of storage is assigned. Upon assignment, a record is made as to whether or not the particular material involved would be crucial to continued system operation and thus would need to be relocated if the storage element in which it was contained were to be taken off line. The third and fourth steps described above are accomplished through the use of hardware which enables the system to process even complex storage interleave patterns and to reassign the material in a manner that makes it retrievable by the same instructions and references that were used to access the originally assigned material.

One of the key elements in the ability of the system to perform the storage reconfigurations described herein is a set of hardware-generated storage-descriptor values which allow the software to process reconfigurations involving differing interleaved patterns through the use of a single algorithm. The storage-descriptor values are provided to a system control program (SCP) by a separate maintainence and service support facility (MSSF). The descriptors determine the relation between addresses and storage elements, thus enabling identification of the addresses which contain crucial material and which therefore must be reassigned before a storage element may be taken off line. These descriptor values also enable the SCP to determine which storage addresses may be used as a sink for the crucial data without destroying other crucial data.

One other function that must be performed prior to copying material and reassigning addresses is an integrity check of the storage elements or portions thereof to which the data is to be copied. Since this data is crucial to continued operation of the system, it is desirable that it be copied into an area of storage which has exhibited a high degree of integrity (i.e., very low, or zero, rate of error occurrence). For this reason, the reassignment is not made until the SCP has analyzed failure patterns stored within the various storage elements of the memory system and a high integrity area has been identified.

After an appropriate target area within the remaining memory system has been identified, the MSSF idles all system processors and processing elements, as well as various external operator controls, while it performs an "exact copy process" to copy the information from the source memory elements to the target memory elements. Real main storage addresses are then assigned from the former to the latter. After this is accomplished, the original memory element may be taken off line while the remainder of the system continues to perform. During the "exact copy process," data from the source memory element may be found to have uncorrectable errors in it. When such a situation is encountered, the source data will be rewritten in the target (or "sink") memory elements in such a manner that access of it will result in an indication of an uncorrectable error. However, the indication will be such that the system is able to recognize that the data was originally found to be uncorrectable when it was read from another source. This will distinguish it from data that may be found to have errors due to memory failures in the sink.

DESCRIPTION OF THE DRAWINGS

In the accompanying drawings forming a material part of this disclosure.

DETAILED DESCRIPTION

In order to understand the storage configuration tables upon which the preferred embodiment of this invention relies, the reader is referred to U.S. Pat. No. 4,280,176 for Memory Configuration, Address Interleaving, Relocation and Access Control System, issued July 21, 1981 and assigned to International Business Machines Corporation.

Additional information relating to an environmental system in which this invention may be implemented is found in the following manuals, all available from International Business Machines Corporation. The manuals are part of the IBM Maintenance Library, 3081 Processor Complex. Individual titles are:

Processor Unit Introduction/Maintenance (PRM) (Form No. SY22-7061);

Central Storage and External Data Controller Introduction/Maintenance (CSM) (EDC) (Form No. SY22-7062);

3082 Processor Controller Maintenance (PCM) (Form No. SY22-7063);

3082 Processor Controller Theory/Diagrams (PCT) (Form No. SY22-7064);

3082 Processor Controller User's Guide (UGD) (Form No. SY22-7065);

Power Operation and Maintenance (PWR) (Form No. SY22-7066);

3087 Coolant Distribution Unit Coolant Distribution and Maintenance (CDU) (Form No. SY22-7067);

3089 Power Unit Installation/Maintenance (PGM) (Serial Numbers Below 41000) (Form No. SY22-7069);

Return Codes and Messages (RCM) (Form No. SY22-7070);

Maintenance Guide (Form No. SY22-7071);

3089 Power Unit Installation/Maintenance (PGM) (Serial Numbers 41000 and Above) (Form No. SY22-7072).

The contents of the above patent and all of the above manuals are incorporated into this specification by this reference.

Also incorporated into this specification is the entire contents of the appended microfiche listing of code for implementation of the instructions Vary Storage Element On/Off Line.

Figure 1:
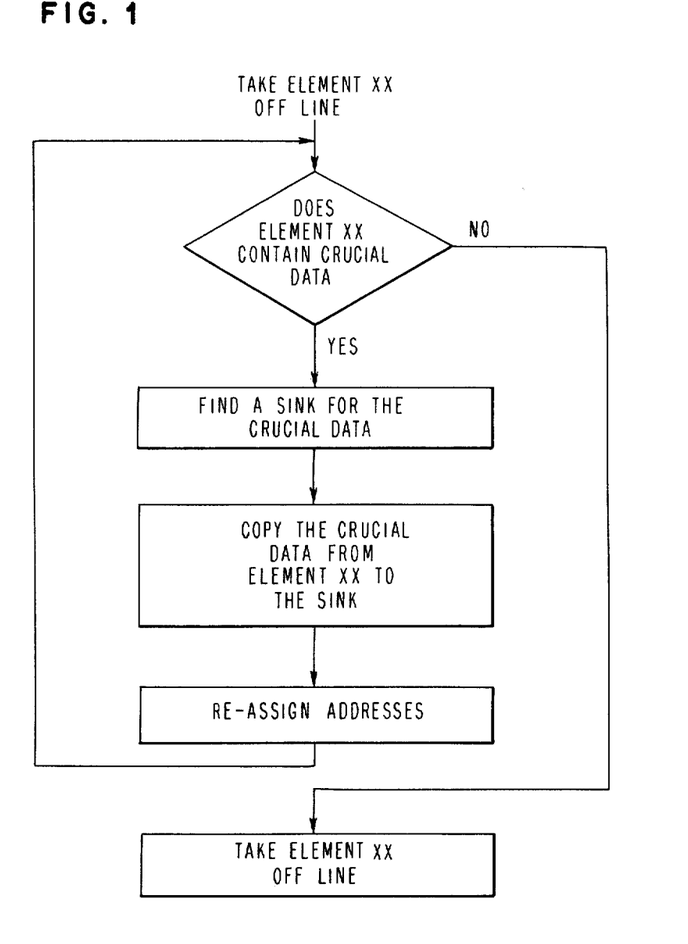
FIG. 1 is a simplified logic flow diagram of the invention.
Figure 2A:
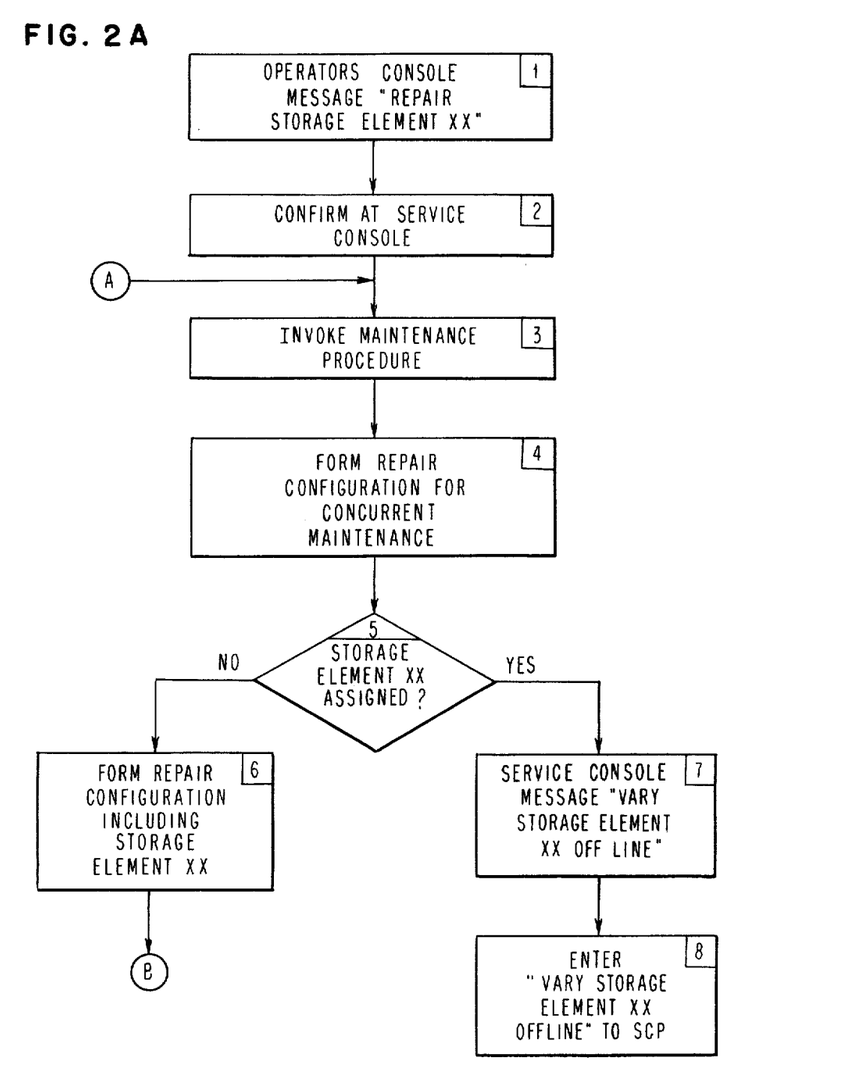
FIGS. 2A, 2B, 2C, 2D and 2E are a more detailed logic flow diagram of the invention.
Figure 2B:
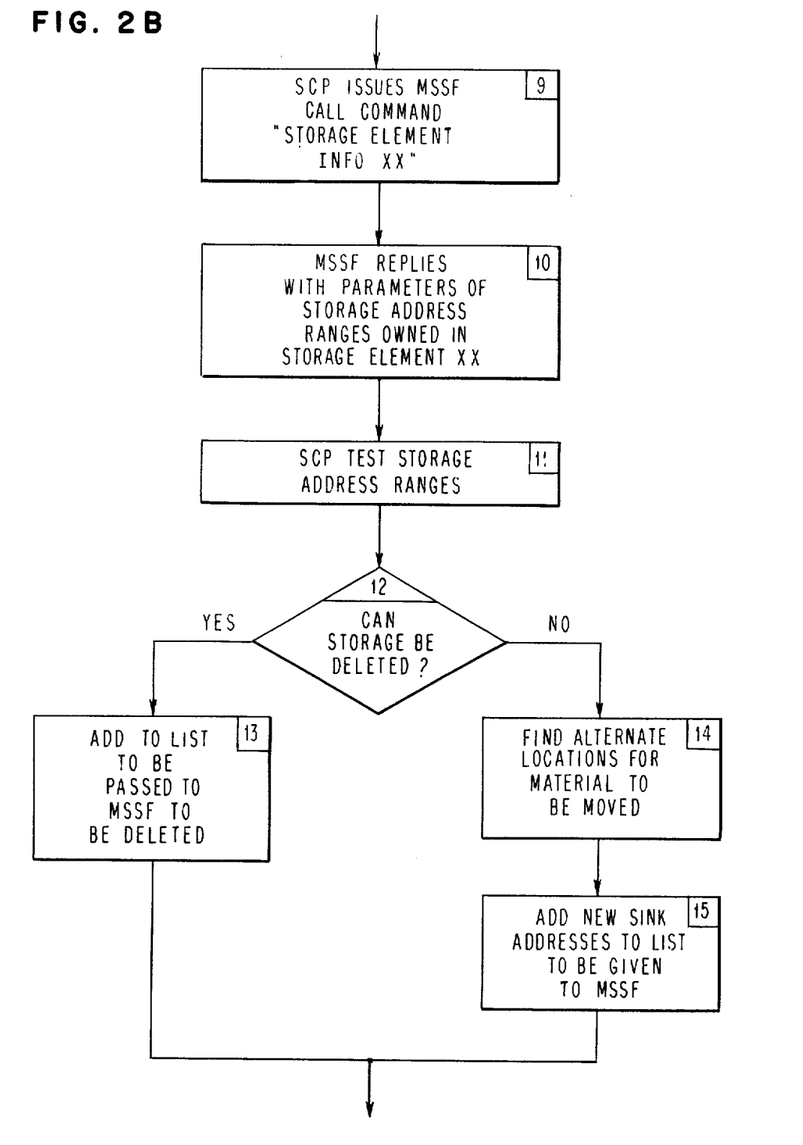
Figure 2C:
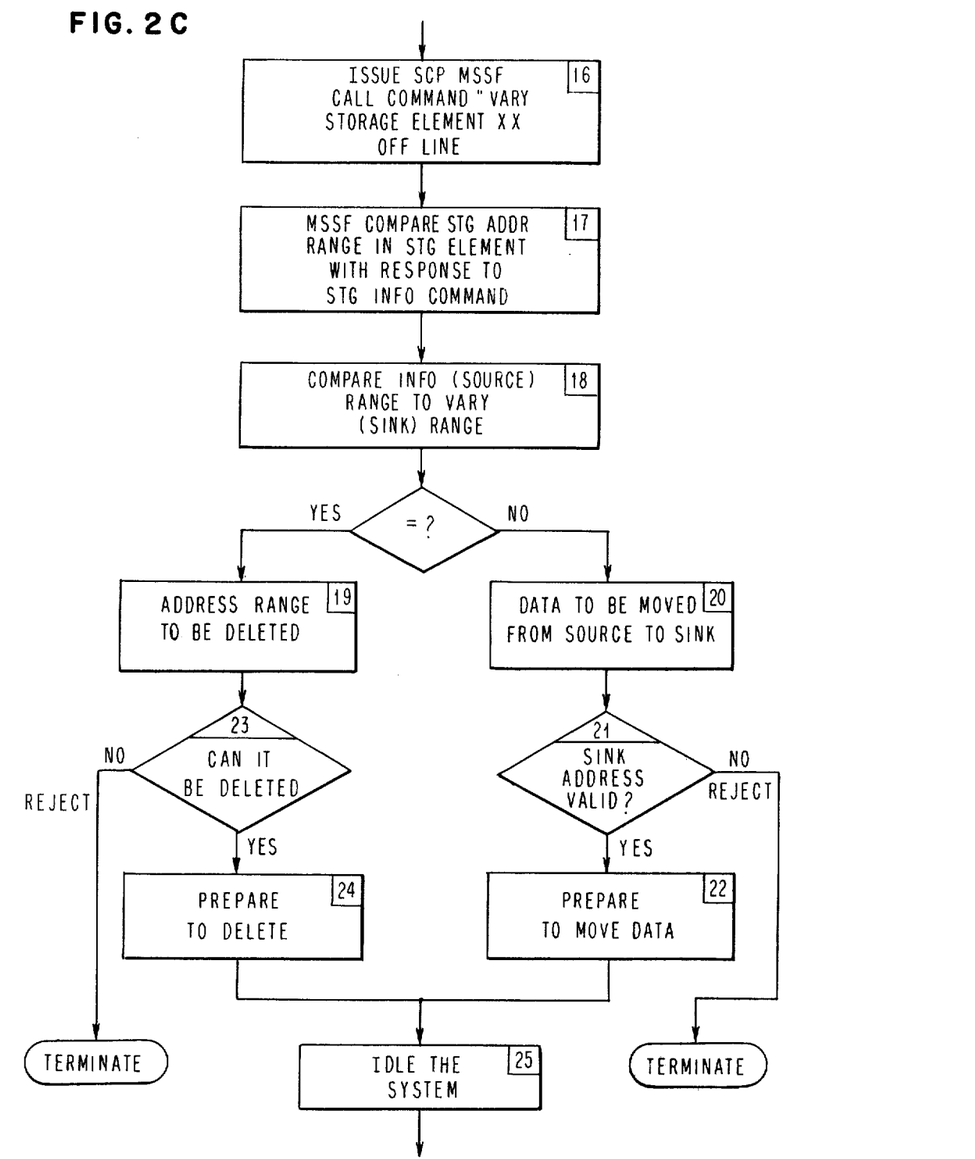
Figure 2D:
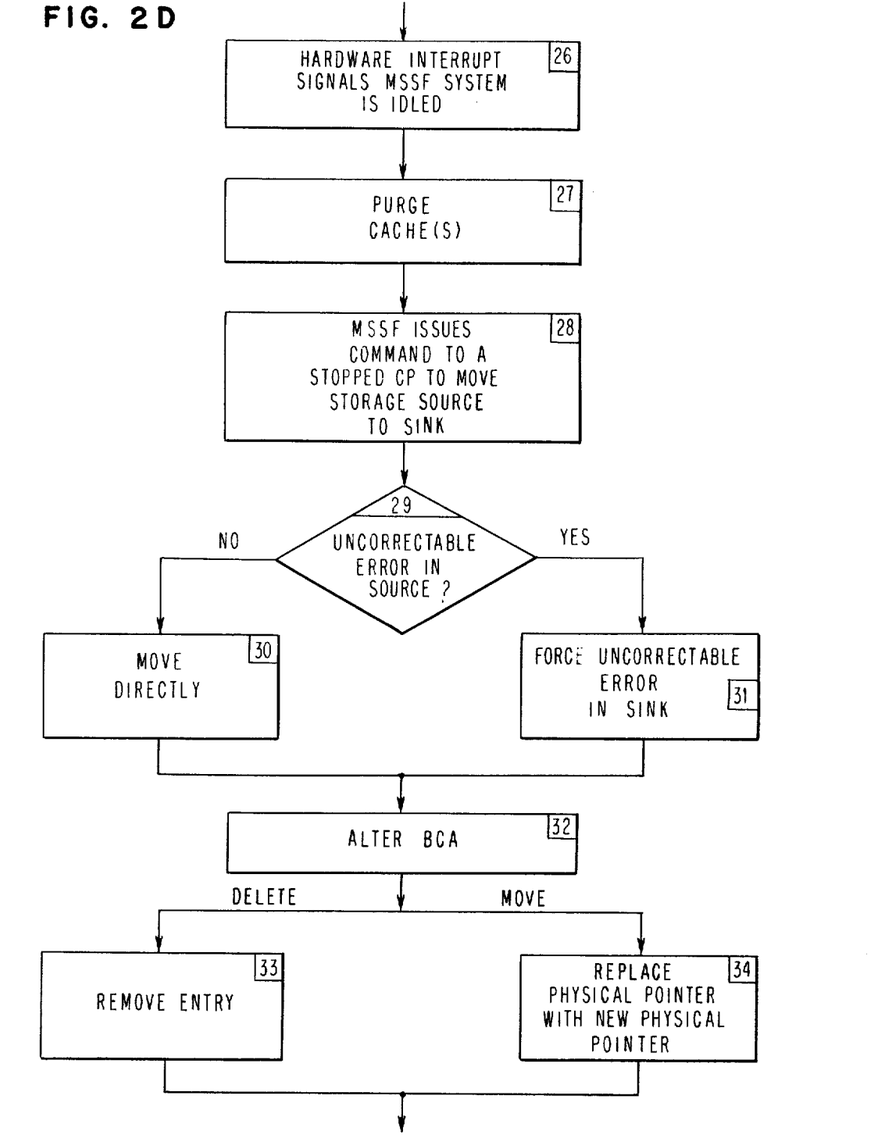
Figure 2E:
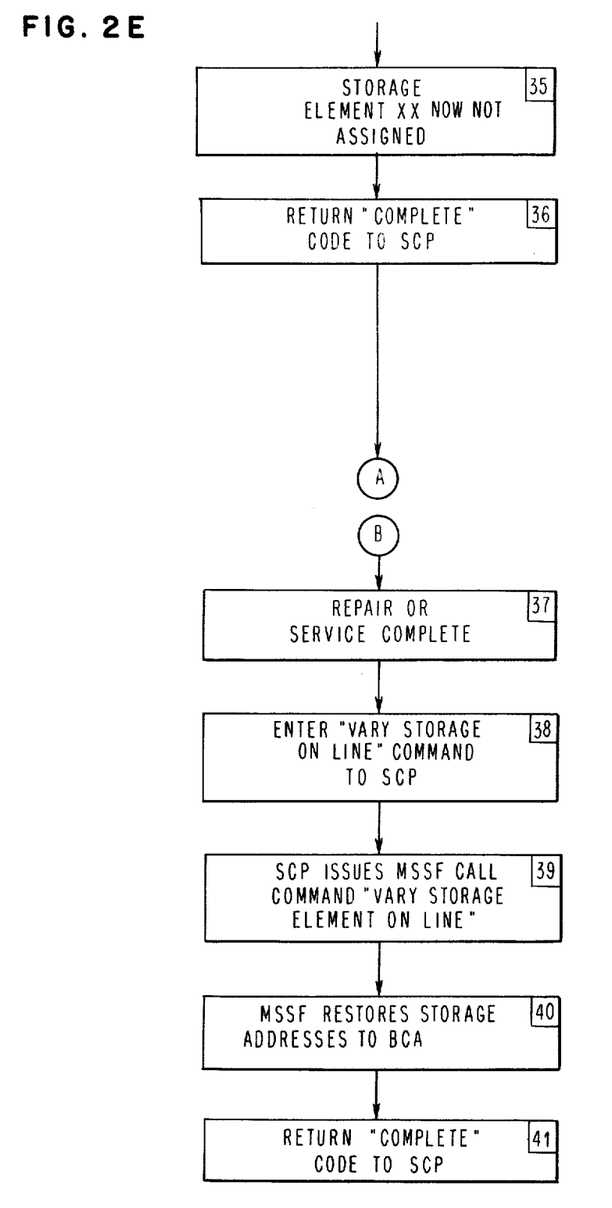

FIG. 1 shows a general overview of this invention as it might be implemented on a typical data processing system. Operation of the invention is initiated by a signal or request to take a particular storage element off line. There may be a variety of reasons for taking a storage element off line, for example: excessive error occurrence has shown it to be in need of repair; it is scheduled for routine maintenance; it is to be reassigned for use by another processor; or it is simply to be physically removed from the system. The signal to take the element off line can result from manual or automatic input.

After receiving a signal to take a particular storage element off line, the system must first determine whether that element contains crucial data that must be retained. In the environmental system discussed herein, examples of such crucial data are: the address "absolute zero"; the hardware systems area; a patch area; and unpaged resident control programs. If the storage element does not contain any crucial data it is simply taken off line, and the system will continue as if that element had not been part of its configuration.

If the element does contain crucial data, the system must find a place to store the crucial data. The new storage areas, or sink, must be large enough and reliable enough to be an adequate storage medium for the crucial data. Of course, it is also essential that the sink itself not contain other crucial data which cannot be deleted from the system.

After an acceptable sink has been found for the crucial data contained in the storage element that is to be taken off line, the crucial data must be copied into the sink storage elements. (As will be understood by those skilled in the art, the crucial data that is taken from one storage element may need to be distributed among several other storage elements when the memory system is reconfigured.) After the crucial data has been copied, there will generally need to be a reassignment of addresses. This is typically done through the use of tables which translate addresses used by the various programs into addresses which are used by the hardware system to access data.

After the crucial data has been copied to an acceptable sink and addresses have been reassigned, the memory system reconfiguration is complete. The original storage element can then be taken off line as was requested.

Additional details of a preferred implementation of the invention are shown in FIG. 2. For a variety of reasons (for example, exceeding a predetermined threshold number of errors) the system can generate a message to the operator telling him to repair storage element XX. The operator would then call a repair man or customer engineer (CE). The CE will invoke a maintenance procedure in the system. The maintenance procedure would include forming a repair configuration which includes element XX.

The MSSF, prior to forming a repair configuration must determine if storage element XX is presently assigned to a part of the system. If it is not, the repair configuration can be immediately formed. If the storage element is presently assigned, the MSSF will inform the operator that it must be varied off line. The system operator will then enter the command VARY STORAGE ELEMENT XX OFFLINE to the system control program SCP.

Next, the SCP will issue a command to the MSSF (by means of an MSSF CALL) which requests storage element information for element XX. The MSSF will access storage element ownership tables and will return parameters defining storage address ranges that are contained in storage element XX. These parameters are returned by the MSSF to the SCP so the SCP can determine whether or not those storage ranges can be deleted from the system.

The SCP determines whether or not the storage ranges can be deleted by testing them to see what storage addresses they contain and what kind of data and/or programs they contain. For example, the address "absolute zero" must be retained in the environmental system for architectural purposes. Therefore, if the storage element which is to be varied offline contains location "absolute zero" the portion which contains that address must be moved. Also, certain portions of storage such as the hardware systems area and certain "patches" or "fixes" must be retained because the system has been set up in such a manner that the SCP expects to find these items at particular addresses. Therefore, these portions of data cannot be logically switched to another storage area; they must retain the original address to which they were located. Of course, these specific examples are related to the specific environmental system in that they are part of its defined architecture. When implementing this invention on another system, different tests, dictated by the architecture of the system on which the invention is implemented, will need to be performed.

For the addresses that have to be moved, the SCP must find alternate locations which will be able to accommodate the data. The SCP will need to insure that the alternate locations (or "sinks") do not already contain crucial data, and that the alternate locations are reasonably error-free; that is, they have not been the source of excessive uncorrectable errors. As the SCP identifies address ranges in the sources which contain crucial data, and it identifies available sinks which can accept the crucial data, it creates a list of these addresses. After the list has been completed, it is passed from the SCP to the MSSF. This is accomplished by the SCP issuing to the MSSF a command to VARY STORAGE ELEMENT XX OFFLINE.

In the preferred embodiment, sinks are selected that are synchronous with the sources in terms of various characteristics, particularly interleave factors such as type of interleave, interval and size. In the environmental system, the interleave factors are typically two-way interleave with four megabyte intervals and 4K pages. Therefore, a source that is, for example, two megabytes on even 4K pages would be moved to a sink that is two megabytes on even or odd 4K pages.

Alternatively, in a sequential storage environment, contiguous sources of a given size could be moved to contiguous sinks of corresponding size. As will be recognized by those skilled in the art, the amount (if any) of synchronism between source and sink storage areas will be dependent on criteria related to the particular system on which this invention is being implemented.

In this environmental system, areas that are to be simply deleted are indicated to the MSSF by setting into the list of sink addresses an address identical to the corresponding source address for a given range. This indicates to the MSSF that the data will not be moved, thus, in effect, causing it to be deleted when the element is varied off line. When this equality is detected by the MSSF, it will check the data to make sure that it does not contain absolute zero or other essential system data. Assuming that the data passes these tests, it will be deleted by simply having its addresses removed from the system lists. If the data is of such a nature that it must not be deleted, the MSSF will signal the occurrence of an error in the reconfiguration attempt and will issue a "reject code" to the SCP. The vary operation will then be terminated.

If the source and sink addresses are not equal, the system will prepare to move the data. As a final check prior to the move, it will verify the validity of the sink address. If the address range is valid, the move will take place. If the sink address range is not valid, a reject code will be issued by the MSSF to the SCP.

Now the system must be prepared to make the data move. Under control of the MSSF, the system is idled and all caches are purged in order to make sure that main storage is completely updated. The MSSF then issues a command to one of the stopped processors to actually move storage addresses from the source to the sink. In the preferred embodiment, while this move takes place error records in the source are checked to see if any uncorrectable errors (UEs) are present. In this situation, if any UEs are present the data transfer will continue and an error stop will not occur. However, the data moved to the sink will be recorded in such a manner that, when it is subsequently accessed, a UE will be indicated. This is done through the use of a unique error syndrome. This will prevent a UE from the source from being changed when it is stored into the sink in such a manner that it subsequently, incorrectly, appears to be good data.

The next step is to alter the addressing of the system to match physically the locations of the new data. This is done by updating pointers in the storage configuration tables (BCA). Pointers are "updated" by replacing obsolete ones in the tables with new ones. These tables are more completely described in U.S. Pat. No. 4,280,176 which may be referred to for more complete information on this matter. After a pointer has been replaced, the original, source, address range is available for work or further assignment.

After all of the required data moves have taken place, and all of the address ranges in the source storge element have been replaced or deleted from the BCA, an external interrupt from the MSSF to the SCP signals completion of the reconfiguration. This results in a message on the operators console. The CE then again attempts to form a repair configuration. This time, when the system again checks the storage element to be included in the repair configuration, it will find that the element is not assigned. The repair configuration will then be formed and the CE can repair the storage element.

After repair is complete, the CE, or system operator, can enter a command to VARY STORAGE ELEMENT XX ONLINE to the SCP. The SCP will pass the command to the MSSF to put the storage element back on line. The MSSF will then restore the storage address ranges that were deleted when element XX was varied off line to the BCA, thus again making those ranges available to the system.

Further details of the preferred embodiment of this invention can be realized from a review of the flow diagram shown in FIG. 2. A situation requiring utilization of this invention may be triggered by a message on the system console indicating a need to repair storage element XX. This need could result from a number of errors found in storage element XX over time having exceeded a predetermined threshhold, or it could simply indicate that some normal routine maintenance is required. Typically, the system operator will then call a repair man or customer engineer (CE) who will utilize a service console to learn the reason for the repair call and to confirm that storage element XX is the one that needs attention (block 2).

The CE, through the service console, will invoke a maintenance procedure (block 3). As part of the maintenance procedure, the first step performed by the MSSF microcode is to attempt to form a "repair configuration". The purpose of the repair configuration is to isolate storage element XX so that it can be repaired or serviced concurrently with the continued running of the remainder of the system (block 4).

Before taking storage element XX off line for servicing, the system must determine whether or not that particular storage element is presently assigned to one or more user operations. That is, the system must determine whether or not user data is contained and operational in that storage element (block 5). If that storage element is not assigned, then it is available to be taken away from the rest of the system and to be part of the repair configuration (block 6). The CE can then do whatever needs to be done on that storage element. In that situation, no operational interface is needed between the running system control program (SCP) and the storage element.

If storage element XX is assigned to user operations, a message will return to the CE on the service console that; in order to do concurrent maintenance on storage element XX, it must be "varied off line" (block 7). Then, via the operators console, a command to VARY STORAGE ELEMENT XX OFFLINE is entered. In the preferred embodiment of this invention, that command is entered through the operators console and communicates directly with the SCP (block 8). (In a multiprocessor system, in which more than one SCP may be operational, each SCP which could be utilizing storage element XX must receive the command.) The SCP then takes control and issues an MSSF CALL COMMAND "STORAGE ELEMENT INFO XX" to the MSSF. This command asks the MSSF to consult its tables and find out what storage addresses actually are resident in the physical storage element that is to be taken off line. The MSSF replies (block 10) with the parameters indicating the storage address ranges that are operational in storage element XX. The SCP takes the information returned to it from the MSSF and, utilizing a storage page frame table (SPFT), tests the storage address ranges that were identified (block 11). (The SPFT checks control blocks to determine the characteristics of data residing in the storage address ranges. The SPFT identifies the characteristics (e.g., assigned/unassigned, crucial/non-crucial) for the data resident in the storage area.) The major result of this test is a determination of whether or not each particular address range can simply be deleted from the operating system (block 12) or whether some of the material it contains must be saved. The address range can be deleted if the storage page frame table indicates that the address range is empty or is not crucial. If that is the case, the address range is added to a list that is transmitted to the MSSF simply indicating that the address range is to be deleted. Once the storage element is removed, that address range will no longer be available to the system (block 13).

If the address range cannot be deleted, it must be moved to another available area. In the preferred embodiment of this invention, examples of areas that cannot be deleted and therefore must be moved are address ranges that contain: absolute zero; the hardware systems area; the prefix area; and various fixes. If material in the storage element must be moved, the SCP must find alternate locations for it (block 14). The sink locations should be synchronous or symmetrical in size to the address ranges that have to be removed from the storage element that is to be taken from the system. For example, if four megabytes are to be moved from the storage element to be repaired, an alternate four megabyte sink must be found.

Once the available sink space is found, the SCP identifies the new address range and provides it as the alternate address for the data to be moved from storage element XX. In other words, the new sink address is given to the MSSF by the SCP in place of the source addresses from the which the material is to be moved (block 15).

The following example may help to explain this reassignment of address ranges. Let us assume that, in the storage element to be removed, address ranges 0, 2 and 4 are operational. Let us further assume that address range 0 contains the address absolute zero, thus being one of the ranges that must be moved. Address ranges 2 and 4 will be regarded as examples of address ranges that can be deleted. In the case of this example, the INFO command (block 9) returns address ranges 0, 2 and 4 to the SCP. The result of the interrogation shown in block 12 indicates that ranges 2 and 4 can be deleted but range 0 cannot. With respect to ranges 2 and 4, they will be passed back to the MSSF in a list of ranges to be deleted (block 13). When a new sink address is identified for address range 0, that new sink address will be added to the list of addresses returned to the MSSF indicating that it is the new sink for data contained in address range 0. For example, if it is determined that address range 7 will be the sink for material contained in address range 0, that new sink address will be added to the list given to the MSSF by the SCP.

After the SCP has found new sink addresses for data to be moved and has set them up as described above, the SCP issues an MSSF CALL command, VARY STORAGE ELEMENT XX OFF LINE (block 16). The MSSF, when it receives the command, compares the storage address range (block 17) in the physical element with the response previously generated to the storage INFO command as described above with respect to block 9. The two ranges defined as source and sink are compared (block 18). An equal comparison (source and sink are the same) indicates that the range is to be deleted and is to be deleted from the storage address ranges available to the system (block 19). If they are not equal (block 20) the data located in the address range of the INFO command (the source) must be moved to the address range contained in the VARY STORAGE ELEMENT OFF LINE command (the sink).

As part of the move process, the validity of the sink address must be checked (block 21). If the sink address is not valid, a "reject" is returned to the SCP and the operation is terminated. If the sink address range is valid, the MSSF prepares to move the data (block 22).

Prior to deleting an address range (block 19) several tests must be made. First (block 23) the system must insure that the range to be deleted does not contain absolute 0, the hardware system area or the prefix area. These are hardware areas that must be maintained in the system in order for the system to remain operational. If the address range to be deleted contains any of these three areas, a "reject" is set up and returned to the SCP and the address ranges are not allowed to be deleted. If the address range passes these tests, the system will prepare to delete it (block 24).

Whether an address range is to be deleted or material is to be moved, the next step (block 25) is to idle the system. This involves stopping the system from performing further fetches or stores. New requests are locked out and requests in process are completed. When the system is idled, a hardware interrupt notifies the MSSF (block 26). If the system is a store-in-cache system (as is the case in the preferred environment of this invention) the latest copy of much data could be contained in processor caches. Therefore, before moving data from one storage location to another, all cache data must be restored to its original source in main storage.

For this reason, each processor cache must be purged of its data (block 27). Then, the MSSF issues a command to the stopped processors to move material at source storage addresses (in the storage element that is to be varied off line) to sink address ranges that have been identified to receive the material (block 28). While performing this move, the processor microcode examines the source to determine if the source contains any uncorrectable data errors (block 29). If there are no uncorrectable in the source, data will be moved directly from the source to the sink (block 30). Correctable errors that might be in the source will be corrected prior to storage into the sink. If there are uncorrectable errors in the source, then (block 31) an indication of the uncorrectable error will be placed in the sink. Thus, if the source contained one or more uncorrectable errors, the sink will also exhibit an uncorrectable error syndrome. This is a protective measure so that data, after it is moved, appears the same in the sink locations as it did in the source. After successful completion of the moves (block 30 or block 31) the addressing controls of the system (the system controller and BCA configuration array) must be altered in order that the material that has been moved to the sink will be accessible (block 32). The addresses within the BCA configuration array are altered and pointers established for the moves that were made and for the deletions that are about to be made. If a deletion is involved (block 33) the entry within the BCA control array is simply removed. If data has been moved from the source, the original source address remains as a valid entry in the BCA configuration array. However the pointers have to be altered (block 34) to point to the new physical location. In the example given above, address range 0 has been moved to address range 7. Address range 0 is still a valid entry in the BCA, but the physical pointers now must point to it in a new physical storage element. When storage element XX is then removed from the system, address range 7 will become unavailable.

Once alteration of the BCA has been accomplished, storage element XX can be indicated as not assigned to a user (block 35). This is because all its entries have been removed either by being deleted or by being moved to an alternate storage element. A return code is passed from the MSSF to the SCP via an external interrupt mechanism to indicate that the command VARY STORAGE ELEMENT XX OFF LINE has been completed (block 36). (This must be done for each operating SCP in a multiprocessor system.) The CE is informed, via the operators console, that the VARY instruction has been completed. He can then, via the service console, request a maintenance procedure for repair configuration for storage element XX (block 3). This returns us to block 35 where the system checks to see that the storage element is not assigned to a user (which now should be the case) and the repair configuration is formed (block 6).

After the repair or service has been completed (block 37) the CE will advise the system operator to enter the command VARY STORAGE ON LINE to the SCP (block 38). The SCP then issues an MSSF CALL command VARY STORAGE ELEMENT XX ON LINE (block 39) to the MSSF. The MSSF has retained a record of the address ranges that were in storage element XX when it was varied off line and it will restore those ranges to the BCA, again making them available to the system (block 40). This restoration of ranges will take into consideration any moves of material that had been accomplished prior to varying the storage element out of the system. For example, in the example given above, storage range 0, which had originally been in the storage element that was varied off line, had been moved to another storage element in place of its storage range 7. Thus, when storage element XX was varied off line, storage range 0 remained in the system and storage range 7 was removed. Also, storage ranges 2 and 4, which were found to be susceptible of deletion, were also taken off line. Thus, when storage element XX is returned to the system, address ranges 7, 2 and 4 will be returned to the operating system for further use. A return code is passed from the MSSF to the SCP via an external interrupt mechanism to indicate that the command VARY STORAGE ELEMENT XX ON LINE has been completed (block 41).

While the preferred embodiment of this invention, as described above, is implemented almost entirely in microcode, those skilled in the art will recognize that some or all of the invention could equally well have been implemented in hardware, in software or in some combination of hardware, software and/or microcode. The precise manner of implementation on any given system will depend upon the nature of the environmental system, the particular skills and knowledge of the implementor (that is, whether his expertise lies primarily in hardware, software or microcode, or in some combination of them) and various other considerations that are basically extrinsic to the invention itself. It is precisely because the invention can be implemented in so many different ways that we have chosen to describe it primarily in terms of its logic flow. Those skilled in the art will recognize that the above description coupled with the logic flow diagram can be readily interpreted as a complete description of a hardware implementation of the invention, a software implementation of the invention, or another type of implementation appropriate to a particular environmental system.

While the invention has been particularly shown and described with reference to a preferred embodiment thereof, it will be understood by those skilled in the art that the foregoing and other changes in form and details may be made therein without departing from the spirit and scope of the invention.

Having thus described our invention, what we claim as new, and desire to secure by Letters Patent is:

1. In a data processing system in which data are scattered among various physical storage elements, a method for taking a storage element off line comprising the following steps:
 identifying the specific physical storage element that is to be taken off line;
 identifying, within said specific storage element, portions thereof containing crucial material that is essential to the continued operation of the data processing system;
 identifying, in storage elements other than said specific storage element, a new area that is large enough to hold said crucial material;
 copying said crucial material to said new area; and
 re-assigning addresses so that references to said crucial material will properly result in accesses of said crucial material from said new area.

2. The method of claim 1 wherein, during said copying step, data from said specific storage element which contains uncorrectable errors is copied to said new area in a form which indicates that the source data contained an uncorrectable error.

3. The method of claim 2 further including, prior to said copying step, checking the integrity of said new area.

4. The method of claim 3 wherein said new area is selected to be synchronous in terms of type of interleave, interval and size with the areas from which said crucial material is to be copied.

5. The method of claim 1 or 4 including the further step of repeating the sequence of steps beginning at least with said second identifying step in order to ensure that said specific storage element no longer contains crucial material.

6. In a data processing system in which data are scattered among various physical storage elements, apparatus for taking a storage element off line comprising:

means for identifying the specific physical storage element that is to be taken off line;

means for identifying, within said specific storage element, portions thereof containing crucial material that is essential to the continued operation of the data processing system;

means for identifying, in storage elements other than said specific storage element, a new area that is large enough to hold said crucial material;

means for copying said crucial material to said new area; and means for re-assigning addresses so that references to said crucial material will properly result in accesses of said crucial material from said new area.

7. The apparatus of claim 6 wherein said means for copying includes:

means responsive to detection of uncorrectable errors in material read from said specific storage element to cause data to be written to said new area in a form which indicates that the source data contained an uncorrectable error.

8. The apparatus of claim 7 further including:

means for checking the integrity of said new area before copying material into it.

9. The apparatus of claim 8 wherein said new area is synchronous in terms of type of interleave, interval and size with the areas from which said crucial material is to be copied.

* * * * *